(12) United States Patent
Ho et al.

(10) Patent No.: US 9,129,957 B1
(45) Date of Patent: Sep. 8, 2015

(54) METHOD OF FORMING A METAL BUMP

(71) Applicant: Chung Yuan Christian University, Chung Li (TW)

(72) Inventors: Ching-Yuan Ho, Chung Li (TW); Chang-Chun Lee, Chung Li (TW)

(73) Assignee: CHUNG YUAN CHRISTIAN UNIVERSITY, Chung Li (TW)

( * ) Notice: Subject to any disclaimer, the term of this patent is extended or adjusted under 35 U.S.C. 154(b) by 0 days.

(21) Appl. No.: 14/461,703

(22) Filed: Aug. 18, 2014

(30) Foreign Application Priority Data

May 7, 2014 (TW) .............................. 103116316 A

(51) Int. Cl.
*H01L 21/44* (2006.01)
*H01L 23/498* (2006.01)
*H01L 23/00* (2006.01)

(52) U.S. Cl.
CPC ........... *H01L 23/49816* (2013.01); *H01L 24/11* (2013.01)

(58) Field of Classification Search
CPC .............. H01L 23/49816; H01L 24/11; H01L 2224/81; H01L 24/81
USPC .................................. 438/613, 617, FOR. 343
See application file for complete search history.

(56) References Cited

U.S. PATENT DOCUMENTS

| 7,726,544 B2 * | 6/2010 | Fang et al. ................ 228/180.22 |
| 8,497,200 B2 * | 7/2013 | Matejat et al. ................ 438/614 |
| 8,871,631 B2 * | 10/2014 | Lamprecht et al. ........... 438/612 |
| 2011/0189848 A1 * | 8/2011 | Ewert et al. .................... 438/612 |

\* cited by examiner

*Primary Examiner* — Sheila V Clark
(74) *Attorney, Agent, or Firm* — Muncy, Geissler, Olds & Lowe, P.C.

(57) ABSTRACT

A method for forming a metal bump is provided. Firstly, a photo-resist layer is formed on an IC chip by using a lithographic process. The photo-resist layer comprises a metal bump reserved groove and a metal bump slit reserved portion with the extent covering a metal pad. The metal bump slit reserved portion is formed on the metal pad and within the metal bump reserved groove. Then, a deposition process is applied to form the metal bump in the metal bump reserved groove and have the metal bump slit reserved portion penetrating the metal bump. Afterward, the photo-resist layer is removed to leave the metal bump with a metal bump slit therein.

8 Claims, 5 Drawing Sheets

METHOD OF FORMING A METAL BUMP

FIELD OF THE INVENTION

The present invention relates to a method for forming a metal bump, and more particularly relates to a method for forming the metal bump with a metal bump slit by using a lithographic process to form a photo-resist layer having a metal bump reserved groove and a reserved portion for the metal bump slit.

BACKGROUND OF THE INVENTION

Most of the electronic devices nowadays rely on the integrated circuit (IC) chips, such as memory chips or display drivers, to operate. Attending with the development of IC technology, the IC chip has the shrinking trend. However, if the back end packaging technology cannot follow up the improvement of IC technology, the advantage of small IC chips will not be exhibited effectively.

Regarding the packaging technologies for IC chips, there has a metal bump processing for connecting the final metal pad of the IC chip. In order to enhance the density of connections, lithographic technology is usually used for forming the metal pads. After plating the metal bumps, it is usually demanded to apply an additional annealing process on the metal pads to further improve the characteristics and the hardness of the metal pads. However, because the thermal expansion coefficients of the metal pad, the metal bump, and the protection layer interposed between the metal bump and the metal pad are different, there might be cracks between the protection layer and the metal bump generated during the annealing process.

Please refer to FIG. 1, which shows a schematic view of a conventional chip to be packaged. As shown, the chip to be packaged PA100 includes an IC chip PA1 and a metal bump PA2. The IC chip PA1 has a metal pad PA11 and a protection layer PA12. The metal pad PA11 is exposed from the protection layer PA12. When applying annealing process to the chip to be packaged PA100, the crack event is usually formed at the junctions CR1 between the protection layer PA12 and metal pad PA11 as well as the metal bump PA2.

Please refer to FIG. 2, which shows a schematic view of another conventional chip to be packaged. As shown, the chip to be packaged PA100a includes an IC chip PA1a and a metal bump PA2a. The IC chip PA1a includes a metal pad PA11a, a protection layer PA12a, and a plurality of metal wires PA13a. The metal pad PA11a is exposed from the protection layer PA12a. The metal wires PA13a are adjacent to the metal pad PA11a and covered by the protection layer PA12a. Because of the small interval between the metal wires PA13a, air might be left between the metal wires PA13a to form the air chamber PA121a during the formation of the protection layer PA12a. When applying annealing process to the chip to be packaged PA100a, the crack event would be generated not only at the junctions between the protection layer PA12a and metal pad PA11a as well as the metal bump PA2a, but also at the junction CR2 between the protection layer PA12a and the metal wires PA13a due to the air chamber PA121a between the metal wires PA13a.

BRIEF SUMMARY OF INVENTION

The conventional technology needs the annealing process to adjust the characteristics and hardness of the metal bump on the IC chip. Thus, the protection layer might be easily cracked during the annealing process because of the difference between the thermal expansion coefficients of the metal bump and the protection layer.

Accordingly, it is a main object of the prevention to provide a method for forming a metal bump, which adopts the lithographic process for forming the photo-resist layer with the metal-bump reserved groove to form an additional metal bump slit reserved portion, such that during the metallization process for forming the metal bump, the metal layer would be blocked by the metal bump slit reserved portion such that a slit would be formed in the metal bump after removing the photo-resist layer.

A method for forming a metal bump is provided in accordance with the present invention. The method has the metal bump formed on an IC chip, which includes a protection layer and a metal pad exposed from the protection layer. The method for forming the metal bump comprises the steps of: firstly, forming a photo-resist layer on the IC chip by using a lithographic process, wherein the photo-resist layer comprises a metal bump reserved groove and a metal bump slit reserved portion, extent of the metal bump reserved groove covers the metal pad, and the metal bump slit reserved portion is formed on the metal pad and within the metal bump reserved groove; then, applying a deposition process to form the metal bump in the metal bump reserved groove and have the metal bump slit reserved portion penetrating the metal bump; afterward, removing the photo-resist layer to leave the metal bump with a metal bump slit therein.

As mentioned, by using the lithographic process to form the photo-resist layer with the metal bump slit reserved portion, the following metallization process for forming the metal bump would be influenced by the metal bump slit reserved portion such that a metal bump with a metal bump slit therein is formed instead of an integrated metal bump. Therefore, when applying the annealing process to the metal bump, the metal bump slit can be used to absorb thermal stress generated in the metal bump during the annealing process so as to prevent the formation of crack between the metal bump and the protection layer because of the different thermal expansion coefficients.

In accordance with an embodiment of the present invention, the IC chip further comprises a plurality of metal wires adjacent to the metal pad and covered by the protection layer. In the step of forming the photo-resist layer, the extent of metal bump reserved groove further covers the metal wires and the photo-resist layer further comprises a metal wire slit reserved portion formed on the protection layer and within extent of the metal wires. As a preferred embodiment, in the step of forming the metal bump, the metal wire slit reserved portion penetrates the metal bump. In addition, in the step of removing the photo-resist layer, the metal wire slit reserved portion is removed to leave a metal wire slit in the metal bump. By using the metal wire slit reserved portion, a metal wire slit would be formed in the metal bump to absorb thermal stress generated in the metal bump during the annealing process so as to prevent the formation of crack in the protection layer adjacent to the metal wires.

In accordance with an embodiment of the present invention, the deposition process is a plating process.

In accordance with an embodiment of the present invention, after the step of removing the photo-resist layer, the present invention further comprises a step of applying an annealing process to the metal bump.

In accordance with an embodiment of the present invention, the protection layer is made of a semiconductor composite.

In accordance with an embodiment of the present invention, the metal pad is an Aluminum pad.

The embodiments adopted in the present invention would be further discussed by using the flowing paragraph and the figures for a better understanding.

DETAILED DESCRIPTION OF THE INVENTION

Figure 1:
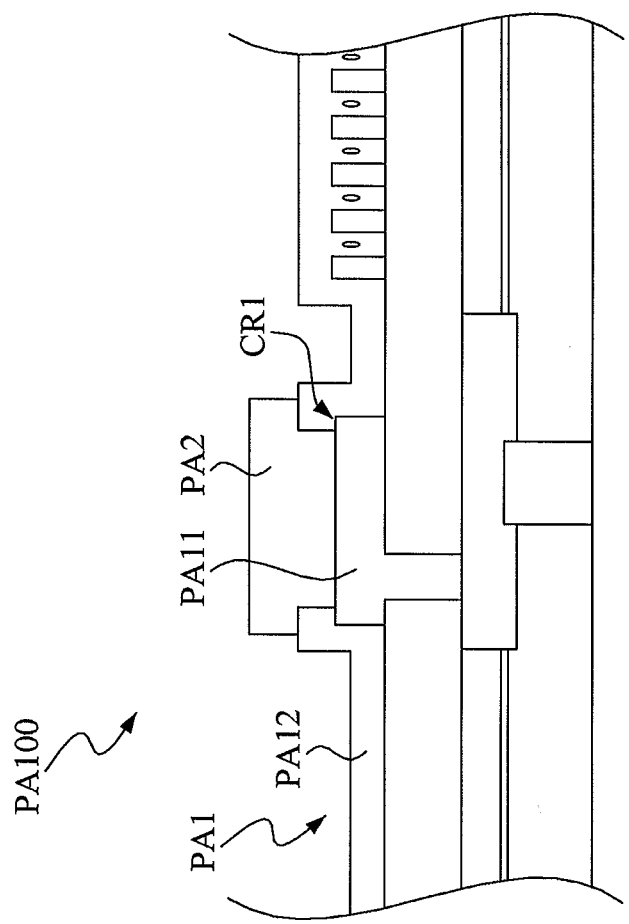
FIG. 1 is a schematic view of a conventional chip to be packaged.
Figure 2:
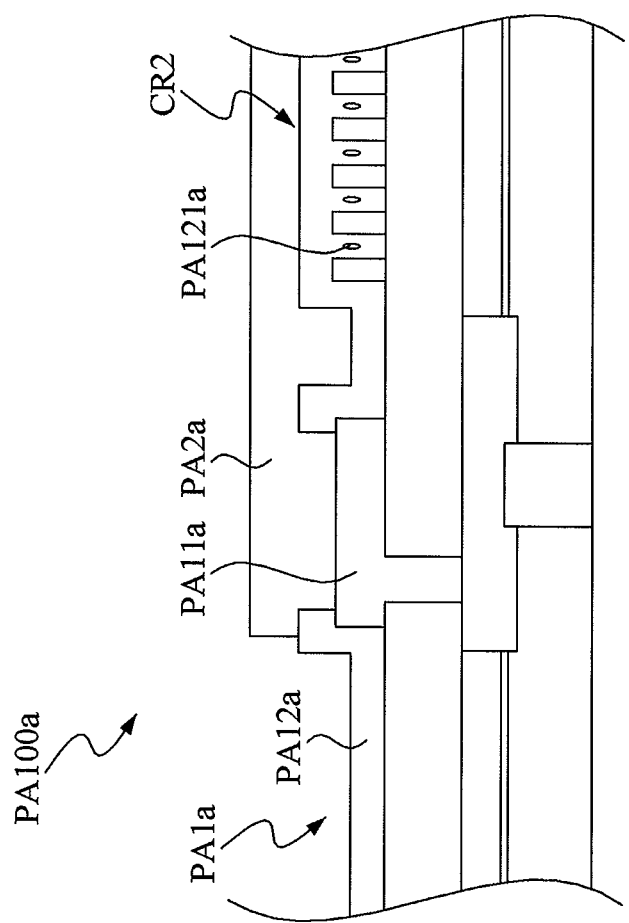
FIG. 2 is schematic view of another conventional chip to be packaged.
Figure 3:
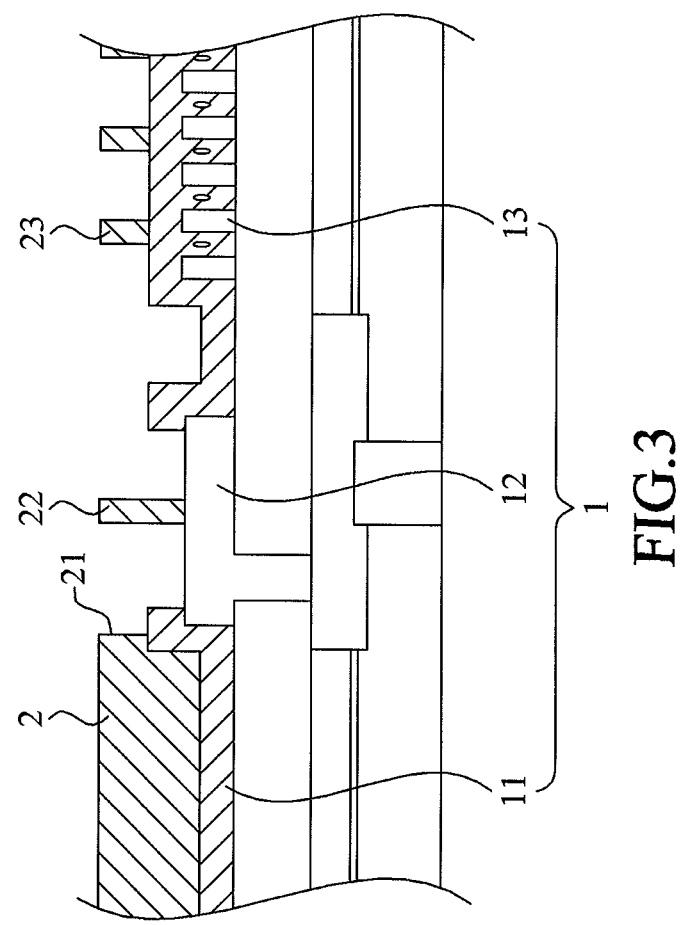
FIG. 3 is a schematic view showing the step of forming a photo-resist layer on the IC chip in accordance with an embodiment of the present invention.
Figure 4:
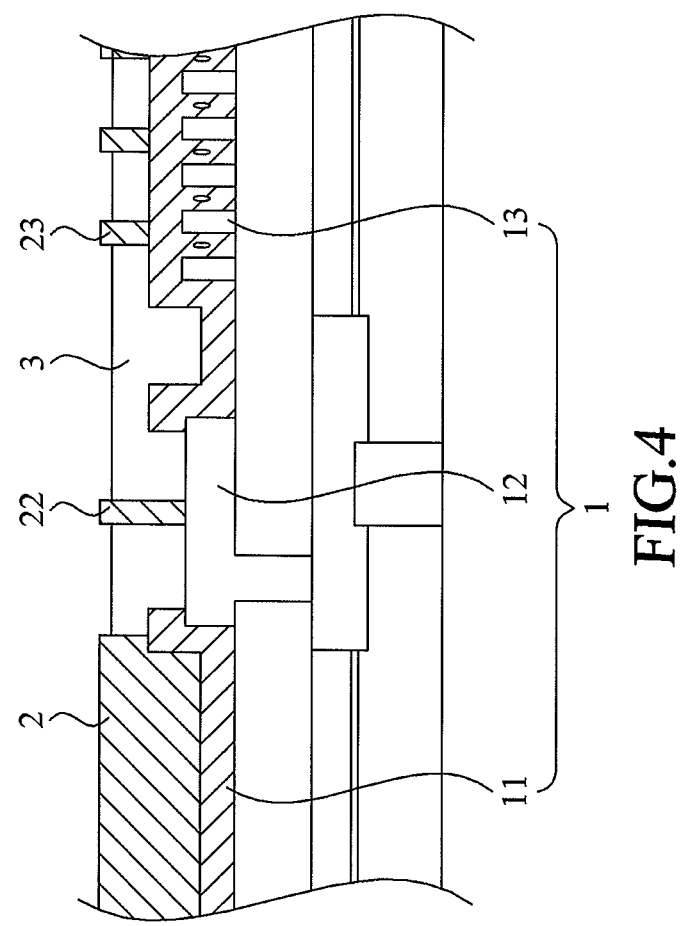
FIG. 4 is a schematic view showing the step of depositing the metal bump within the metal bump reserved groove of the photo-resist layer in accordance with an embodiment of the present invention.
Figure 5:
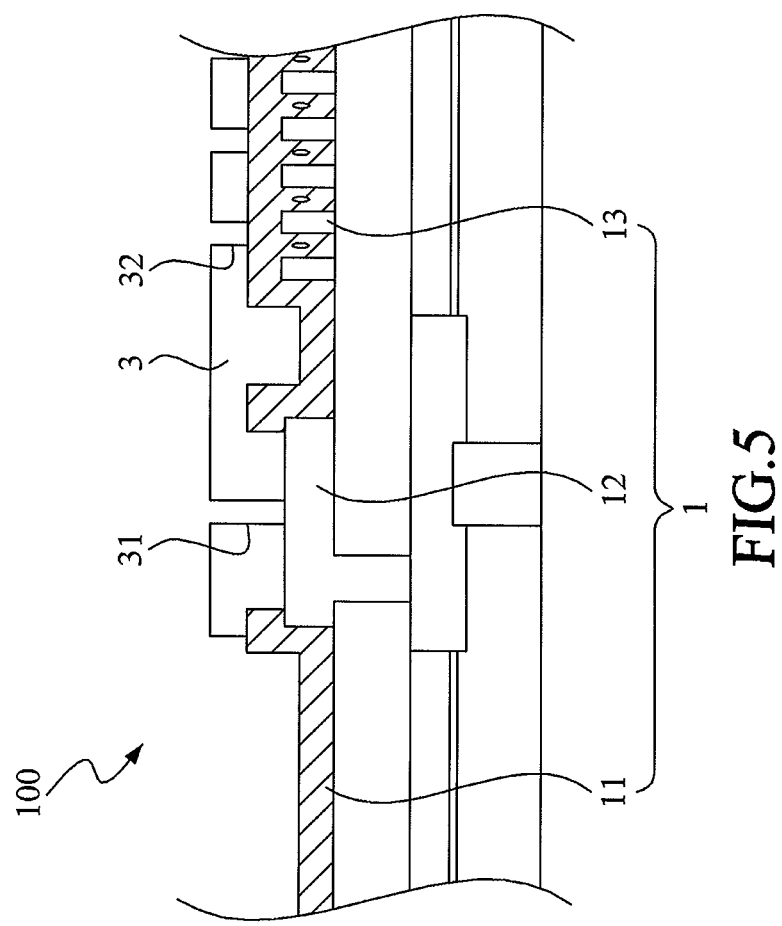
FIG. 5 is a schematic view showing the structure in FIG. 4 after removing the photo-resist layer.

Please refer to FIGS. 3 to 5, wherein FIG. 3 is a schematic view showing the step of forming a photo-resist layer on the IC chip in accordance with an embodiment of the present invention, FIG. 4 is a schematic view showing the step of depositing the metal bump within the metal bump reserved groove of the photo-resist layer in accordance with an embodiment of the present invention, and FIG. 5 is a schematic view showing the structure in FIG. 4 after removing the photo-resist layer.

As shown, a method for forming a metal bump applicable to the packaging process of an IC chip 1 is provided. The IC chip 1 has a protection layer 11, a metal pad 12, and a plurality of metal wires 13. The metal pad 12 is exposed from the open of the protection layer 11. The metal wires 13 are adjacent to the metal pad 12 and covered by the protection layer 11. Wherein, the protection layer 11 may be formed of semiconductor composite, such as silicon nitride, and the metal pad 12 may be an Aluminum pad.

Firstly, a photo-resist layer 2 is formed on the IC chip 1 by using a lithographic process. The photo-resist layer 2 comprises a metal bump reserved groove 21, a metal bump slit reserved portion 22, and a plurality of metal wire slit reserved portions 23. Wherein, extent of the metal bump reserved groove 21 covers the whole metal pad 12 and all the metal wires 13. The metal bump slit reserved portion 22 is formed on the metal pad 12 and within the extent of the metal bump reserved groove 21. The metal wire slit reserved portion 23 is formed on the protection layer 11 and within the extent of the metal wires 13. In practice, the lithographic process is a photo lithographic process.

Then, a deposition process is used to form a metal bump 3 in the metal bump reserved groove 21 and has the metal bump slit reserved portion 22 and the metal wire slit reserved portion 23 penetrating the metal bump 3. In practice, the deposition process is a plating process and the metal bump 3 may be formed of conductive metals such as copper.

Afterward, the photo-resist layer 2 is removed such that a chip 100 ready to be packaged is formed. In the process, the metal bump slit reserved portion 22 is removed to form a metal bump slit 31 in the metal bump 3 and the metal wire slit reserved portion 23 is removed to form a plurality of metal wire slits 32 in the metal bump 3.

Finally, an annealing process is applied to the metal bump 3 to rearrange the atoms so as to improve the characteristics and density of the metal bump 3.

As mentioned, because the photo-resist layer is formed with the metal bump reserved groove, the metal bump slit reserved portion, and the metal wire slit reserved portions by using the lithographic process, the metal bump formed in the following metallization process would be restricted in the metal bump reserved groove. In addition, because both the metal bump slit reserved portion and the metal wire slit reserved portion are located in the metal bump reserved groove, the metal bump slit reserved portion and the metal wire slit reserved portion would be remained in the metal bump. Then, the metal bump slit and the metal wire slits would be formed in the metal bump after removing the photo-resist layer with the metal bump slit reserved portion and the metal wire slit reserved portions.

Because of the formation of the metal bump slit and the metal wire slits, the thermal stress generated in the metal bump when applying the annealing process to the metal bump would be released by the metal bump slit and the metal wire slits and the crack events in the protection layer due to the thermal stress can be prevented.

In addition, in compared with the conventional technology, the method provided in the present invention does not introduce any additional step. That is, the metal bump with slits can be formed just by using a mask with different design of lithographic pattern, such that the formation of cracks due to the different thermal expansion coefficients of the metal bump and the protection layer can be prevented.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

We claim:

1. A method for forming a metal bump, which has the metal bump formed on an IC chip, the IC chip including a protection layer and a metal pad exposed from the protection layer, and the method comprising the steps of:

(a) forming a photo-resist layer on the IC chip by using a lithographic process, wherein the photo-resist layer comprises a metal bump reserved groove and a metal bump slit reserved portion, extent of the metal bump reserved groove covers the metal pad, and the metal bump slit reserved portion is formed on the metal pad and within the metal bump reserved groove;

(b) applying a deposition process to form the metal bump in the metal bump reserved groove and have the metal bump slit reserved portion penetrating the metal bump; and (c) removing the photo-resist layer to leave the metal bump with a metal bump slit therein.

2. The method for forming the metal bump of claim 1, wherein the IC chip further comprises a plurality of metal wires adjacent to the metal pad and covered by the protection layer, and in step (a), the extent of metal bump reserved groove further covers the metal wires and the photo-resist layer further comprises a metal wire slit reserved portion formed on the protection layer and within extent of the metal wires.

3. The method for forming the metal bump of claim 2, wherein in step (b), the metal wire slit reserved portion penetrates the metal bump.

4. The method for forming the metal bump of claim 3, wherein in step (c), the metal wire slit reserved portion is removed to leave a metal wire slit in the metal bump.

5. The method for forming the metal bump of claim 1, wherein the deposition process is a plating process.

6. The method for forming the metal bump of claim 1, after the step (c), further comprising a step (d) of applying an annealing process to the metal bump.

7. The method for forming the metal bump of claim 1, wherein the protection layer is made of a semiconductor composite.

8. The method for forming the metal bump of claim 1, wherein the metal pad is an Aluminum pad.

\* \* \* \* \*